(12) United States Patent
Sun et al.

(10) Patent No.: US 8,782,571 B2
(45) Date of Patent: Jul. 15, 2014

(54) MULTIPLE PATTERNING PROCESS FOR FORMING TRENCHES OR HOLES USING STITCHED ASSIST FEATURES

(75) Inventors: Yuyang Sun, Wappingers Falls, NY (US); Norman S. Chen, Poughkeepsie, NY (US); Jian Liu, Beacon, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 58 days.

(21) Appl. No.: 13/414,971

(22) Filed: Mar. 8, 2012

(65) Prior Publication Data

US 2013/0236836 A1 Sep. 12, 2013

(51) Int. Cl.
*G06F 17/50* (2006.01)

(52) U.S. Cl.
USPC .................................. 716/53; 430/5

(58) Field of Classification Search
USPC .......................... 430/5; 716/53, 55
See application file for complete search history.

(56) References Cited

U.S. PATENT DOCUMENTS

| 8,069,423 | B2 * | 11/2011 | Ghan et al. | 716/55 |
| 8,082,524 | B2 * | 12/2011 | Gleason et al. | 716/50 |
| 8,111,921 | B2 * | 2/2012 | Hsu et al. | 382/181 |
| 8,391,605 | B2 * | 3/2013 | Hsu et al. | 382/181 |
| 8,404,403 | B2 * | 3/2013 | Ogadhoh et al. | 430/5 |
| 2011/0119648 | A1 | 5/2011 | Chen et al. | |
| 2011/0318927 | A1 * | 12/2011 | Li et al. | 438/692 |
| 2012/0102442 | A1 * | 4/2012 | Ghan et al. | 716/55 |
| 2012/0122023 | A1 * | 5/2012 | Hsu et al. | 430/5 |
| 2013/0024822 | A1 * | 1/2013 | Hsieh et al. | 716/52 |
| 2013/0232456 | A1 * | 9/2013 | Kallingal et al. | 716/53 |

OTHER PUBLICATIONS

Cho et al., "Double Patterning Technology Friendly Detailed Routing," 2008 IEEE, pp. 506-511.
Pan et al., "Layout Optimizations for Double Patterning Lithography," Dept. of ECE, the University of Texas and IBM T. J. Watson Research Center.

* cited by examiner

*Primary Examiner* — Stewart Fraser
(74) *Attorney, Agent, or Firm* — Amerson Law Firm, PLLC

(57) ABSTRACT

One illustrative method disclosed herein involves identifying an overall target pattern comprised of at least one hole-type feature, decomposing the overall target pattern into at least a first sub-target pattern and a second sub-target pattern, wherein the first sub-target pattern and the second sub-target pattern each comprise at least one common hole-type feature, generating a first set of mask data information corresponding to the first sub-target pattern, and generating a second set of mask data information corresponding to the second sub-target pattern.

9 Claims, 3 Drawing Sheets

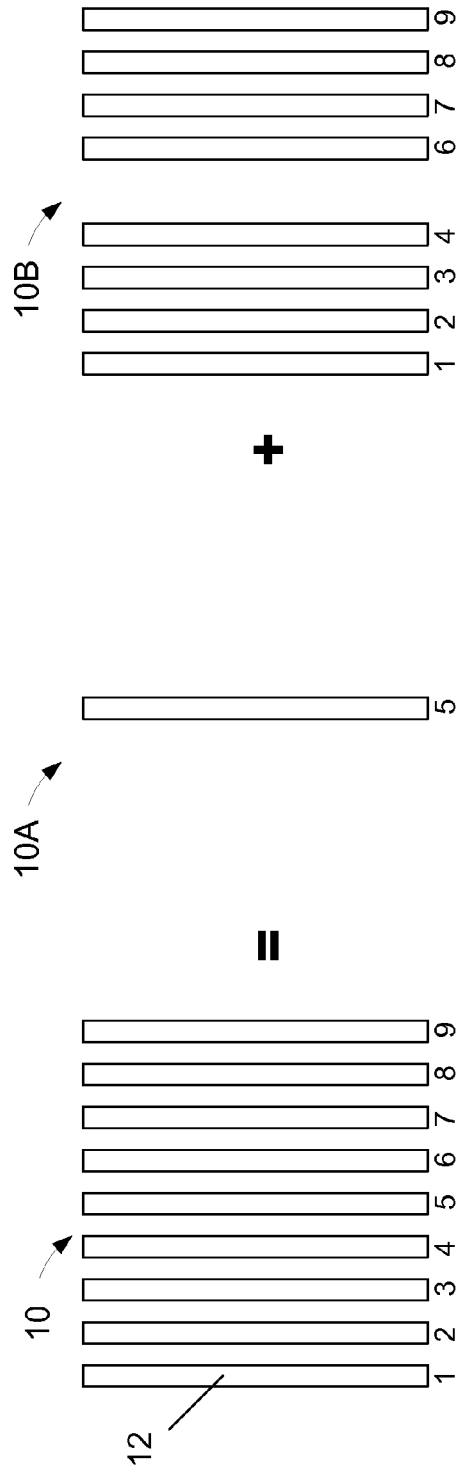
Figure 1A
(Prior Art)
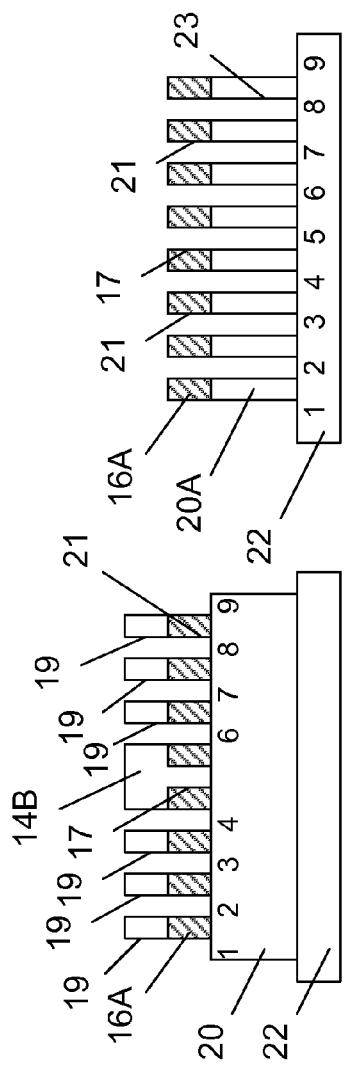
Figure 1B
(Prior Art)
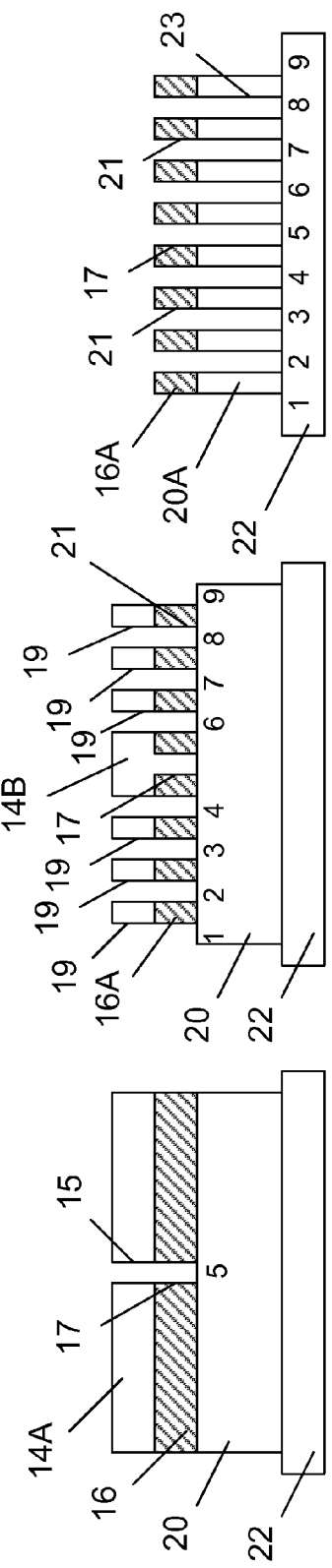
Figure 1C
(Prior Art)
Figure 1D
(Prior Art)

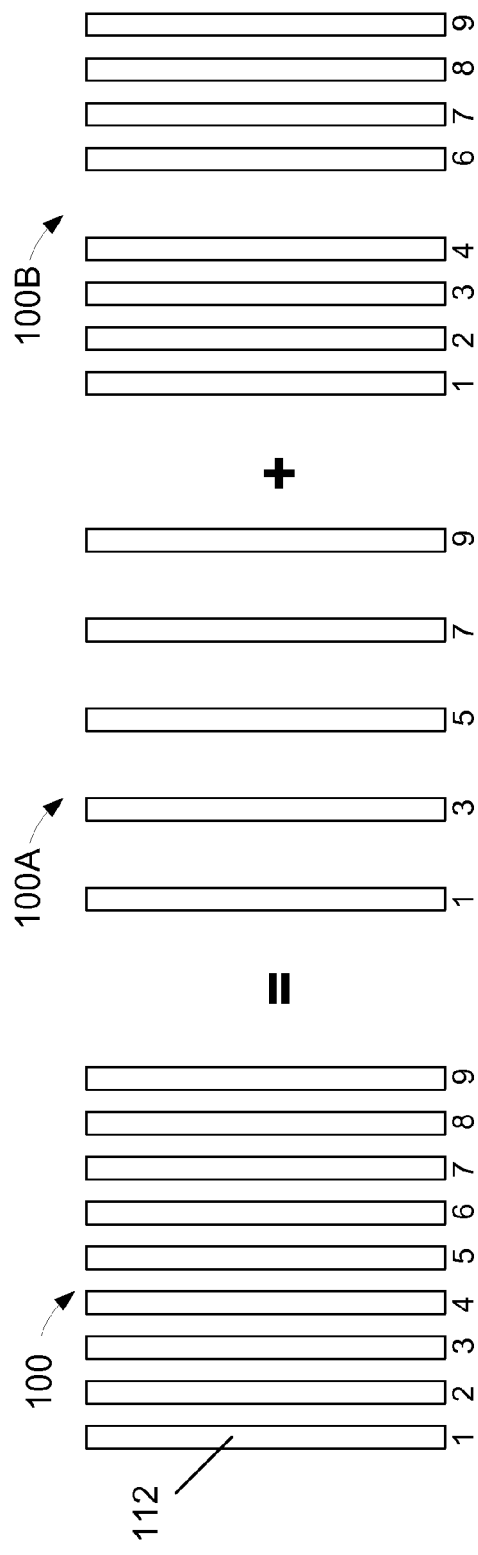
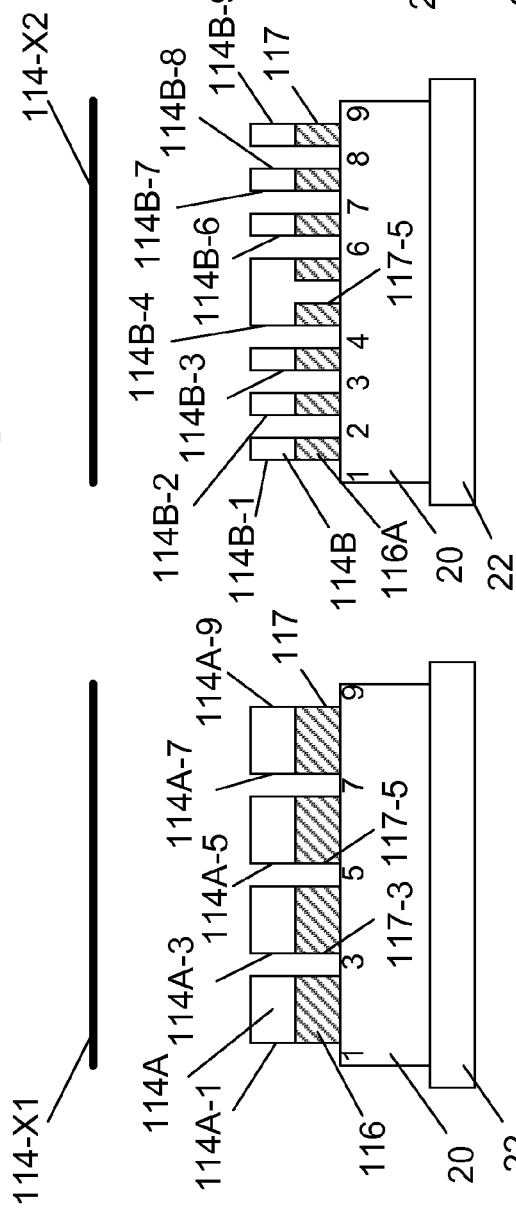

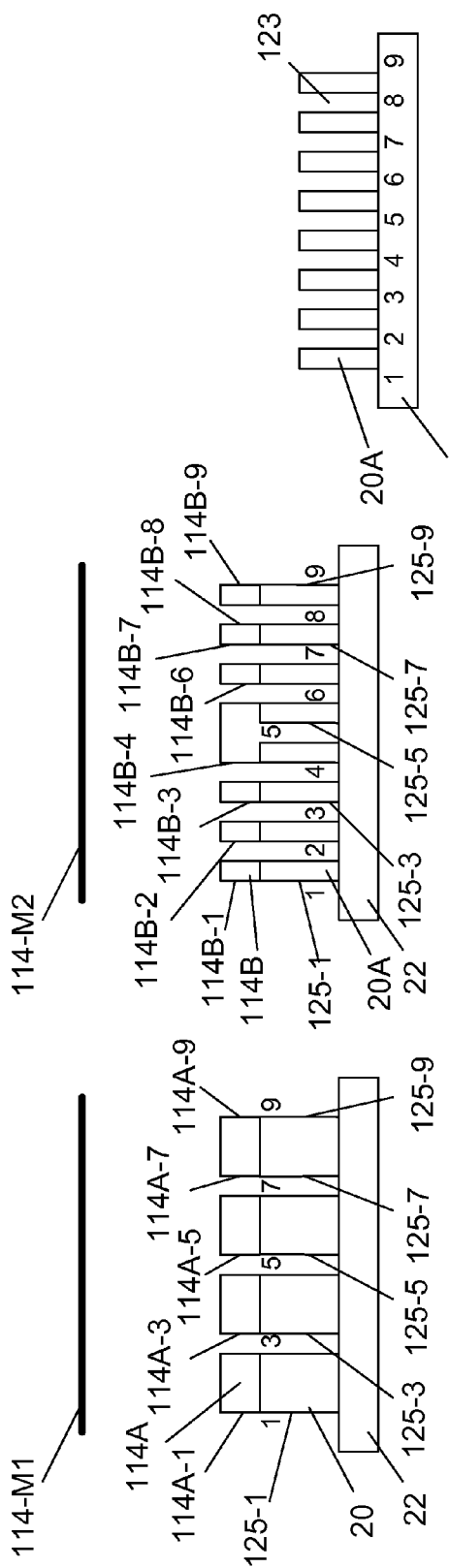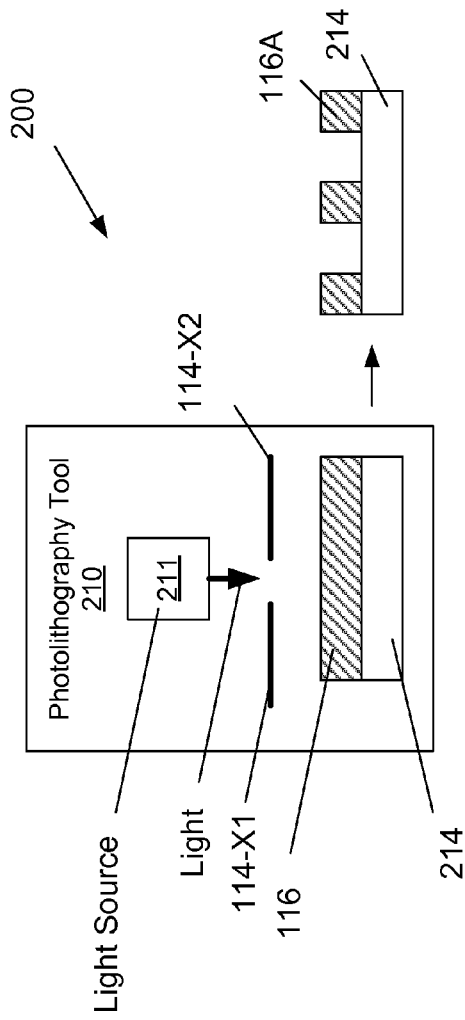

MULTIPLE PATTERNING PROCESS FOR FORMING TRENCHES OR HOLES USING STITCHED ASSIST FEATURES

BACKGROUND OF THE INVENTION

1. Field of the Invention

Generally, the present disclosure relates to the manufacture of sophisticated semiconductor devices, and, more specifically, to the design of masks or reticles for use in multiple patterning processes, such as double patterning processes, that are performed to form hole-type or trench-type features, and the use of such masks or reticles in various photolithography systems to manufacture integrated circuit products.

2. Description of the Related Art

Photolithography is one of the basic processes used in manufacturing integrated circuit products. At a very high level, photolithography involves (1) forming a layer of light or radiation-sensitive material, such as photoresist, above a layer of material or a substrate, (2) selectively exposing the radiation-sensitive material to a light generated by a light source (such as a DUV or EUV source) to transfer a pattern defined by a mask or reticle (interchangeable terms as used herein) to the radiation-sensitive material, and (3) developing the exposed layer of radiation-sensitive material to define a patterned mask layer. Various process operations, such as etching or ion implantation processes, may then be performed on the underlying layer of material or substrate through the patterned mask layer.

Of course, the ultimate goal in integrated circuit fabrication is to faithfully reproduce the original circuit design on the integrated circuit product. Historically, the feature sizes and pitches (spacing between features) employed in integrated circuit products were such that a desired pattern could be formed using a single patterned photoresist masking layer. However, in recent years, device dimensions and pitches have been reduced to the point where existing photolithography tools, e.g., 193 nm wavelength photolithography tools, cannot form single patterned mask layers with all of the features of the overall target pattern. Accordingly, device designers have resorted to techniques that involve performing multiple exposures to define a single target pattern in a layer of material. One such technique is generally referred to as double patterning. In general, double patterning is an exposure method that involves splitting (i.e., dividing or separating) a dense overall target circuit pattern into two separate, less-dense patterns. The simplified, less-dense patterns are then printed separately on a wafer utilizing two separate masks (where one of the masks is utilized to image one of the less-dense patterns, and the other mask is utilized to image the other less-dense pattern). Further, in some cases, the second pattern is printed in between the lines of the first pattern such that the imaged wafer has, for example, a feature pitch which is half that found on either of the two less-dense masks. This technique effectively lowers the complexity of the photolithography process, improving the achievable resolution and enabling the printing of far smaller features than would otherwise be possible using existing photolithography tools.

FIGS. 1A-1D depict one illustrative double patterning process. An initial overall target pattern 10 that is comprised of nine illustrative trench features 12 is depicted in FIG. 1A. The space (or pitch) between the features 12 in the initial overall target pattern 10 is such that the initial overall target pattern 10 cannot be printed using a single mask with available photolithography tools. Thus, in this illustrative example, the initial overall target pattern 10 is decomposed into a first sub-target pattern 10A (comprised of the feature number 5) and a second sub-target pattern 10B (comprised of the features 1-4 and 6-9). The sub-target patterns 10A, 10B are referred to as "sub-target patterns" because each of them contain less than all of the features in the initial overall target pattern 10. The features that are incorporated in the sub-target patterns 10A, 10B are selected and spaced such that the features may be readily formed using available photolithography tools. Ultimately, when the mask design process is completed, data corresponding to the sub-target patterns 10A, 10B (modified as necessary during the design process) will be provided to a mask manufacturer that will produce a tangible mask (not shown) to be used in a photolithographic tool to manufacture integrated circuit products.

FIG. 1B depicts an illustrative wafer or substrate 22 having a material layer 20 formed thereabove. A hard mask layer 16 is formed above the material layer 20. A first patterned photoresist mask layer 14A is formed above the hard mask layer 16. The first patterned photoresist mask layer 14A was exposed using a mask corresponding to the first sub-target pattern 10A. That is, the first patterned photoresist mask 14A has an opening 15 that corresponds to feature number 5 shown in the first sub-target pattern 10A. As depicted in FIG. 1B, an etching process is performed through the first patterned photoresist mask layer 14A to defined a trench 17 (that corresponds to the feature 5) in the hard mask 16.

In FIG. 1C, the first patterned photoresist mask layer 14A has been removed and a second patterned photoresist mask layer 14B has been formed above the hard mask 16A. The second patterned photoresist mask layer 14B was exposed using a mask corresponding to the second sub-target pattern 10B. That is, the second patterned photoresist mask layer 14B has a plurality of openings 19 that correspond to feature numbers 1-4 and 6-9 shown in the second sub-target pattern 10B. The second patterned photoresist mask layer 14B covers the opening 17 defined using the first patterned photoresist mask layer 14A as shown in FIG. 1B. As depicted in FIG. 1C, an etching process is performed through the second patterned photoresist mask layer 14B to define a plurality of trenches 21 (that correspond to the features 1-4 and 6-9) in the patterned hard mask 16A.

In FIG. 1D, the second patterned photoresist mask 14B has been removed and one or more etching processes have been performed through the patterned hard mask 16A to define a patterned layer of material 20A comprised of a plurality of trenches 23. The trenches 23 define a pattern that corresponds to the features (1-9) in the overall target pattern 10.

It is well known that, for a variety of reasons, photolithography systems do not print exactly what is depicted in a theoretical target pattern, e.g., the lengths of line-type features may be shorter than anticipated, corners may be rounded instead of square, etc. Proximity effects may also cause features that otherwise have the same physical dimensions to print differently during photolithography processing. For example, a so-called "isolated" feature (e.g., a feature where there is no adjacent structure of a given distance of, for example, about 300-500 nm) will print with different dimensions than a so-called "densely-packed" feature (e.g., a feature with adjacent or nearby features) even though both the isolated feature and the densely-packed feature have the same target dimensions. Such variations are often referred to as process variations.

There are several factors that cause such process variations, such as interference between light beams transmitted through adjacent patterns, resist processes, the reflection of light from adjacent or underlying materials or structures, unacceptable variations in topography, etc. Due to such process variations, efforts are made to define and increase an associated process window that will allow formation of functionally acceptable features while accounting for the process variations described above. That is, mask designers seek to identify which aspects of a particular circuit pattern, e.g., a line length, a line width, etc., may be modified such that, accounting for the known process variations, acceptable patterns may be reliably and repeatedly formed in an underlying layer of material or a substrate. For example, in a process that is sometimes referred to as "re-targeting," a line length may be increased or decreased or a line width (critical dimension) may be increased, etc. However, in some applications, the packing density and design rules for a particular circuit are such that there is no room for re-targeting certain features. As a result, in those situations, isolated features may have a very inefficient process window and only SRAFs may be employed to improve the process window of such features. While such SRAFs do improve the process window, they may give rise to reduced depth-of-focus issues. Moreover, as compared to densely-packed features, isolated features tend to have a smaller process window as they tend to be more sensitive to process variations.

The design and manufacture of reticles used in such photolithography processes is a very complex and expensive undertaking as such masks must be very precise and must enable the repeated and accurate formation of a desired pattern in the underlying layer of material (for an etching process). Mask designers have developed several techniques to try to counteract such process variations and to otherwise increase process windows so as to increase the manufacturability of a given circuit pattern. One technique involves the use of so-called sub-resolution assist features (SRAFs). A SRAF is a feature that is formed on a mask, but the size of the SRAF is less than the resolution capability of the particular photolithography tool. Accordingly, while the SRAFs that are present on the mask have an impact on the exposure process, they will not be replicated or printed on the layer of photoresist that is exposed using the mask containing the SRAFs. Typically, a plurality of SRAFs are positioned on a mask adjacent to an isolated feature in an effort to get the isolated feature to print more like a densely-packed feature. Another technique sometimes employed to reduce process variations involves the use of so-called print assist features (PRAFs) on masks. In contrast to SRAFs, PRAFs are of a size such that they will print on the exposed layer of photoresist. Such PRAFs are also typically provided on a mask adjacent to an isolated feature in an effort to get the isolated feature to print more like a densely-packed feature. One example of the use of PRAFs involves the formation of a plurality of PRAFs that correspond to "dummy" gate electrode structures adjacent to an isolated gate electrode structure that is to be formed for an integrated circuit device. The dummy gate electrodes are never intended to function as gate electrodes, but they are actually printed in an effort to reduce or eliminate process variations during the formation of the desired, isolated gate electrode. In some cases, such PRAFs are subsequently removed.

The present disclosure is directed to the design of masks or reticles for use in multiple patterning processes, such as double patterning processes, that are performed to form hole-type or trench-type features, and the use of such masks or reticles in various photolithography systems to manufacture integrated circuit products.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to the design of masks or reticles for use in multiple patterning processes, such as double patterning processes, that are performed to form hole-type or trench-type features, and the use of such masks or reticles in various photolithography systems to manufacture integrated circuit products. One illustrative method disclosed herein involves identifying an overall target pattern comprised of at least one hole-type feature, decomposing the overall target pattern into at least a first sub-target pattern and a second sub-target pattern, wherein the first sub-target pattern and the second sub-target pattern each comprise the at least one common hole-type feature, generating a first set of mask data information corresponding to the first sub-target pattern and generating a second set of mask data information corresponding to the second sub-target pattern. In further embodiments, the method also includes providing the first and second sets of the mask data information to a mask manufacturer for purposes of manufacturing a first mask corresponding to the first sub-target pattern and a second mask corresponding to the second sub-target pattern.

Another illustrative method disclosed herein of imaging an overall target pattern that is comprised of at least first and second sub-target patterns includes obtaining a first mask that is adapted for imaging the first sub-target pattern, obtaining a second mask that is adapted for imaging the second sub-target pattern, wherein the first sub-target pattern and the second sub-target pattern each comprise at least one common hole-type feature, performing a first exposure process using the first mask that corresponds to the first sub-target pattern and performing a second exposure process using the second mask that corresponds to the second sub-target pattern.

BRIEF DESCRIPTION OF THE DRAWINGS

The disclosure may be understood by reference to the following description taken in conjunction with the accompanying drawings, in which like reference numerals identify like elements, and in which:

FIGS. 1A-1D depict one illustrative prior art double patterning process;

FIGS. 2A-2G depict various illustrative methods disclosed herein relating to the design of masks or reticles for use in multiple patterning processes that are performed to form hole-type or trench-type features and to the use of such methods and reticles in manufacturing integrated circuit products; and FIG. 3 schematically depicts an illustrative system disclosed herein for exposing a plurality of substrates using the reticles designed as disclosed herein and for practicing various methods disclosed herein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to the design of masks or reticles (interchangeable terms as used herein and in the claims) for use in multiple patterning processes, such as double patterning processes, that are performed to form hole-type or trench-type features, and the use of such masks in various photolithography systems to manufacture integrated circuit products. For purposes of this disclosure and the claims, the term "hole-type feature" should be understood to include openings, recesses, holes or trenches of any desired shape, depth or configuration. The "hole-type features" referenced herein may extend completely through a layer of material, such as a via for a conductive contactor, or such features may only extend a certain depth into a layer of material, such as a trench for a conductive metal line. As will be readily apparent to those skilled in the art upon a complete reading of the present application, the methods disclosed herein may be employed in the fabrication of a variety of devices, such as logic devices, memory devices, ASICs, etc. With reference to the attached figures, various illustrative embodiments of the methods disclosed herein will now be described in more detail.

FIGS. 2A-2D depict one illustrative example of a method disclosed herein of performing multiple patterning processes, such as a double patterning process, to form hole-type features in an underlying layer of material or substrate. The methods disclosed herein will be disclosed in the context of an illustrative litho-etch-litho-etch (LELE) process that involves use of a hard mask layer. However, as will be appreciated by those skilled in the art after a complete reading of the present application, the methods disclosed herein may be employed in a variety of different lithography processes, such as, for example, a so-called DDL process (vertical and horizontal splitting, involving different illumination for two exposures), a double exposure process (litho-litho-etch (LLE)), a litho-freeze-litho-etch process (LFLE), a spacer process like the so-called SADP process, etc. Thus, the inventions disclosed herein should not be considered as limited to any particular type of lithographic process. It will also be appreciated by those skilled in the art having benefit of the present disclosure that the methods disclosed herein are not limited to the illustrative double patterning process described below. That is, the methods disclosed herein may be employed with any lithography process involving any number of multiple patterning processes.

An initial overall target pattern 100 comprised of a plurality of nine features 112 is depicted in FIG. 2A. The space (or pitch) between the features 112 in the initial overall target pattern 100 is such that the initial overall target pattern 100 cannot be printed using a single mask with available photolithography tools. Thus, in this illustrative embodiment, the initial overall target pattern 100 is decomposed into a first sub-target pattern 100A (comprised of the features 1, 3, 5, 7 and 9), and a second sub-target pattern 100B (comprised of the features 1-4 and 6-9). The sub-target patterns 100A, 100B are referred to as "sub-target patterns" because each of then contain less than all of the features in the initial overall target pattern 100. Importantly, the sub-target patterns 100A, 100B share at least one common hole-type feature. Of course, in practice, the sub-target patterns 100A, 100B may have hundreds or thousands of such common hole-type features. As used herein and in the claims, the phrase "common hole-type feature" means that the same identical feature, in its entirety, is included in both of the sub-target patterns 100A, 100B. That is, if the feature is a rectangular trench having dimensions of A×B, then both of the sub-patterns 100A, 100B will have the same A×B rectangular trench feature. In the example shown in FIG. 2A, hole-type features 1, 3, 7 and 9 are common hole-type features for both of the sub-target patterns 100A, 100B. Additionally, at least one of the hole-type features 112 from the overall target pattern 100 is unique to one of the sub-target patterns 100A, 100B, i.e., it will only be present on one of the sub-target patterns 100A, 100B. In the example shown in FIG. 2A, the hole-type feature 5 is only present in the sub-target pattern 100A. However, in a real-world application, each of the sub-target patterns may contain hundreds or thousands of such unique features. The features that are incorporated into each of the sub-target patterns 100A, 100B are selected and spaced such that the features may be readily formed using available photolithography tools. Ultimately, when the mask design process is completed, mask data information corresponding to each of the sub-target patterns 100A, 100B (modified as necessary during the design process) will be provided to a mask manufacturer that will produce multiple masks (not shown) to be used in a photolithographic tool to manufacture integrated circuit products.

FIG. 2B depicts an illustrative wafer or substrate 22 having a material layer 20 formed there above. The material layer 20 may be any type of material used in semiconductor manufacturing. For example, the material layer 20 may be a layer of insulating material, such as silicon dioxide, where one or more conductive structures, such as metal lines or vias, may eventually be formed. A hard mask layer 116 is formed above the material layer 20. Typically, the hard mask layer 116 will be made of a material that may be selectively etched with respect to material layer 20. For example, in the case where the material layer 20 is made of silicon dioxide, the hard mask layer 116 may be made of silicon nitride.

With continuing reference to FIG. 2B, a first patterned photoresist mask layer 114A is formed above the hard mask layer 116. The first patterned photoresist mask layer 114A was exposed using a schematically depicted mask 114-X1 corresponding to the first sub-target pattern 100A. That is, the first patterned photoresist mask 114A has a plurality of openings (114A-1, 114A-3, 114A-5, 114A-7 and 114A-9) that corresponds to features 1, 3, 5, 7 and 9, respectively, shown in the first sub-target pattern 100A. As depicted in FIG. 2B, a first etching process has been performed through the first patterned photoresist mask layer 114A to defined partially patterned hard mask layer 116 comprised of a plurality of trenches 117 (that correspond to the features 1, 3, 5, 7 and 9) in the partially patterned hard mask layer 116. In some cases, a suffix number designation has been added to various features to indicate the correspondence of that particular feature with a numbered feature shown in the sub-target patterns 100A, 100B. In the example shown in FIG. 2B, trenches 117-3 and 117-5, correspond to the features 3 and 5, respectively.

In FIG. 2C, the first patterned photoresist mask layer 114A has been removed and a second patterned photoresist mask layer 114B has been formed above the partially patterned hard mask layer 116 shown in FIG. 2B. The second patterned photoresist mask layer 114B was exposed using a mask 114-X2 that corresponds to the second sub-target pattern 100B. That is, the second patterned photoresist mask layer 114B has a plurality of openings (114B-1, 114B-2, 114B-3, 114B-4, 114B-6, 114B-7, 114B-8 and 114B-9) that correspond to features number 1-4 and 6-9, respectively, shown in the second sub-target pattern 100B. The second patterned photoresist mask layer 114B covers the trench 117-5 (corresponding to the feature 5) defined in the partially patterned hard mask layer 116 (shown in FIG. 2B) using the first patterned photoresist mask layer 114A. However, as shown in FIG. 2C, the second patterned photoresist mask layer 114 does not mask the other trenches 117 (corresponding to features 1, 3, 7 and 9) that were formed in the partially patterned hard mask layer 116 (shown in FIG. 2B) using the first patterned photoresist mask 114A. As depicted in FIG. 2C, a second etching process was performed through the second patterned photoresist mask layer 114B on the partially patterned hard mask layer 116 to define a further patterned hard mask layer 116A. In the illustrative case where the methods disclosed herein are employed in a double patterning process, the further patterned hard mask layer 116A would be a final patterned hard mask layer that would be used to transfer the pattern in the layer 116A to the underlying material layer 20. The second etching process initially defines a plurality of trenches 117 that correspond to the hole-type features 2, 4, 6 and 8, and re-patterns, or double-etches the trenches 117 that correspond to the hole-type features 1, 3, 7 and 9 that were initially defined in the partially patterned hard mask 116A using the first patterned photoresist mask layer 114A. In short, in this example, the trenches 117 corresponding to the features 1, 3, 7 and 9 are patterned twice, while the trenches corresponding to the features 2, 4, 5, 6 and 8 are only patterned once.

Of course, one skilled in the art having benefit of the present disclosure will recognize that the hole-type features selected from the second sub-target pattern 100B to be incorporated into the first sub-target pattern 100A—features 1, 3, 7 and 9 in the depicted example—and thus patterned or etched twice (i.e., features 1, 3, 7 and 9 are common hole-type features for both of the sub-target patterns 100A, 100B) may involve a matter of design choice that may vary depending upon the particular application. In the example shown herein, where the hole-type feature 5 on the first sub-target pattern 100A is an isolated feature, hole-type features 4 and 6 from the second sub-target pattern 100B were not selected for incorporation into the first sub-target pattern 100A because they are positioned too close to the hole-type feature 5 in the overall target pattern 100. Instead of incorporating the hole-type features 1, 3, 7 and 9 from the second sub-target pattern 100B into the first sub-target pattern 100A, in another embodiment, only the hole-type features 3 and 7 may be incorporated into the first sub-target pattern 100A, which would thus comprise of hole-type features 3, 5 and 7 in this example. In another example, only the hole-type features 1 and 9 may be incorporated into the first sub-target pattern 100A, which would thus comprise of hole-type features 1, 5 and 9 in this example. As noted above, the methods disclosed herein may be applied with a variety of different photolithography processes, although the stitched patterns may be different in the various processes. Additionally, it may be possible to determine by experiment or simulation what distance or range between the feature 5 and any adjacent features can improve the process window with respect to the printing of the first sub-target pattern 100A.

In FIG. 2D, the second patterned photoresist mask 114B has been removed and a third etching process has been performed on the material layer 20 through the further patterned hard mask 116A to define a patterned layer of material 20A comprised of a plurality of trenches 123. The trenches 123 define a pattern that corresponds to the features (1-9) in the overall target pattern 100.

Of course, the hard mask layer 116 may not be employed in all applications as the methods disclosed herein may be employed to transfer the overall target pattern 100 to the material layer 20 without the need for the hard mask layer 116. FIGS. 2E-2F depict such an illustrative process. In FIG. 2E, the first patterned photoresist mask layer 114A (exposed using the mask 114-M1 corresponding to the first sub-target pattern 100A) was formed above the material layer 20. As depicted in FIG. 2E, a first etching process has been performed through the first patterned photoresist mask layer 114A to define a partially patterned material layer 20 comprised of a plurality of trenches 125 (that correspond to the features 1, 3, 5, 7 and 9) in the partially patterned material layer 20. In FIG. 2F, the first patterned photoresist mask layer 114A has been removed and the second patterned photoresist mask layer 114B (exposed using a mask 114-M2 that corresponds to the second sub-target pattern 100B) has been formed above the partially patterned material layer 20 shown in FIG. 2E. The second patterned photoresist mask layer 114B covers the trench 125-5 (corresponding to the feature 5) defined in the partially patterned material layer 20 (shown in FIG. 2E) using the first patterned photoresist mask layer 114A. However, as shown in FIG. 2F, the second patterned photoresist mask layer 114B does not mask the other trenches 125 (corresponding to features 1, 3, 7 and 9) that were formed in the partially patterned material layer 20 (shown in FIG. 2E) using the first patterned photoresist mask 114A. As depicted in FIG. 2F, a second etching process was performed through the second patterned photoresist mask layer 114B on the partially patterned material layer 20 to define a further patterned material layer 20A. The second etching process depicted in FIG. 2F initially defines a plurality of trenches 125 that correspond to the hole-type features 2, 4, 6 and 8, and re-patterns or double-etches the trenches 125 that correspond to the hole-type features 1, 3, 7 and 9 that were initially defined in the partially patterned material layer 20 using the first patterned photo-resist mask layer 114A. In short, in this example, the trenches 125 corresponding to the features 1, 3, 7 and 9 are patterned twice, while the trenches 125 corresponding to the features 2, 4, 5, 6 and 8 are only patterned once. In FIG. 2G, the second patterned photo-resist mask 114B has been removed leaving the further patterned material layer 20A with a plurality of hole-type features 123 that correspond to the features (1-9) in the overall target pattern 100.

As noted previously, the methods disclosed herein may be employed to form masks or reticles to be used in the manufacture of integrated circuit products. Such masks or reticles generally comprise patterns corresponding to the circuit components that are part of an integrated circuit product. The patterns used to create such masks or reticles are generated utilizing computer-aided design (CAD) programs, wherein this process is sometimes referred to as electronic design automation. Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes.

In addition to the methods described above, other techniques may also be employed to produce more accurate masks. For example, well-known software-based optical proximity correction (OPC) techniques may be performed of the first sub-target pattern 100A and the second sub-target pattern 110B in an effort to generate a more accurate mask that can reliably and repeatedly produce the desired pattern on the target material or structure. There are several OPC correction methods that have been employed within the industry, and they may be roughly classified into rule-based approaches and simulation-based approaches. Both of these techniques may be employed with the methods disclosed herein. Additionally, the masks designed as described herein may also include multiple SRAFs (described previously), in an effort to produce a more effective and accurate mask.

FIG. 3 schematically depicts an illustrative system 200 comprised of an illustrative photolithography tool 210 (having a light source 211), reticles 114-X1 and 114-X2, an illustrative substrate or wafer 214 and the hard mask layer 116 formed above the wafer 214. The reticles 114-X1 and 114-X2 are depicted as being positioned side by side in the illustrative photolithography tool 210, but those skilled in the art will recognize that the reticles 114-X1 and 114-X2 will be used in a sequential fashion (as described above) and they may be used in any order. At least portions of the data to be used in manufacturing the reticles 114-X1 and 114-X2 may be generated based on data corresponding to the first sub-target pattern 100A and the second sub-target pattern 100B, respectively, as described above. The data may then be provided to a reticle manufacturer to manufacture the reticles 114-X1 and 114-X2. The reticles 114-X1 and 114-X2 may then be employed in the photolithography tool 210 (which may be of any desired configuration and employ any desired wavelength or form of radiation) in a sequence of traditional photolithography operations, whereby the overall target pattern 100, defined by the combination of the hole-type patterns in both of the reticles 114-X1 and 114-X2, may be transferred to a layer of material, such as the illustrative further patterned hard mask layer 116A depicted in FIG. 2D. Thereafter, the further patterned hard mask layer 116A may be used in fabricating or defining various portions or regions of an integrated circuit product that will be formed in and above the substrate 214. The reticles 114-X1 and 114-X2 may be used to form patterned layers of material above subsequently processed wafers as processing continues. Of course, as noted above, the methods disclosed herein may be employed to transfer the overall target pattern 100 to a material layer without the need for the hard mask layer 116A depicted in FIG. 3. Of course, as mentioned above, the present inventions should not be considered as limited to the illustrative double patterning process described above as the methods disclosed herein may be employed when an overall target pattern is decomposed into any desired number of sub-target patterns. As one example, the method disclosed herein may be employed where the overall target pattern 100 is decomposed into the first and second sub-target patterns 100A, 100B and a third sub-target pattern (not shown). In that case, in one example, each of the three sub-target patterns may all have at least one common hole-type feature. In another example, the first and second sub-target patterns 100A, 100B may share at least one first common hole-type feature, while the second and third sub-target patterns may share at least one second common hole-type feature, wherein the first and second hole-type features are different. Other examples and configurations are of course possible.

In a broad sense, one illustrative method disclosed herein is directed to the design and manufacture of reticles that may be employed in semiconductor manufacturing. As it relates to the design of reticles, the method comprises identifying an overall target pattern 100 comprised of at least one hole-type feature 112, decomposing the overall target pattern 100 into at least first and second sub-target patterns 100A, 100B that are comprised of at least one common hole-type feature (e.g., feature 5 in the examples disclosed herein), generating first and second sets of mask data information corresponding to the first and second sub-target patterns 100A, 100B and providing the first and second sets of mask data information to a reticle manufacturer to manufacture a first mask 114-X1 corresponding to the first sub-target pattern 100A and a second mask 114-X2 corresponding to the second sub-target pattern 100B.

In another broad sense, the present subject matter is related to manufacturing a structure corresponding to an overall target pattern by performing a first exposure process using a first mask 114-X1 that has a pattern corresponding to a first sub-target pattern 100A and performing a second exposure process using a second mask 114-X2 that has a second sub-target pattern 100B, wherein the first and second sub-target patterns are comprised of at least one common hole-type feature (e.g., feature 5 in the examples disclosed herein).

Another illustrative method disclosed herein involves forming an overall target pattern 100 comprised of a plurality of hole-type features 112 in a layer of material (such as the hard mask material 116 or the material layer 20) using a multiple patterning process, wherein the overall target pattern 100 comprises at least a first sub-target pattern 100A and a second sub-target pattern 100B, and wherein the first and second sub-target patterns have at least one common hole-type feature (e.g., feature 5 in the examples disclosed herein). The method generally involves performing a first etching process through the first mask layer 114A having the first sub-target pattern 100A defined therein to transfer the first sub-target pattern 100A to the layer of material, and performing a second etching process through a second mask layer 114B having the second sub-target pattern 100B defined therein to transfer the second sub-target pattern 100B to the layer of material.

Another illustrative method disclosed herein includes forming the first patterned layer of photoresist 114A above a material layer (such as the hard mask material 116 or the material layer 20), performing a first etching process through the first patterned layer of photoresist 114A to define a partially patterned material layer (such as the layers 116 and 20 depicted in FIGS. 2B and 2E, respectively) that have a plurality of hole-type features that correspond to the first sub-target pattern 100A and removing the first patterned layer of photoresist 114A. This illustrative embodiment further includes the steps of forming the second patterned layer of photoresist 114B above the partially patterned material layer, performing a second etching process through the second patterned layer of photoresist 114B to define a further patterned material layer (such as the layers 116A and 20A depicted in FIGS. 2C and 2F, respectively) having a plurality of hole-type features that correspond to the second sub-target pattern 100B, wherein the hole-type features defined in the further patterned material layer that correspond to the at least one common hole-type feature have been exposed to both of the first and second etching processes, and removing the second patterned layer of photoresist 114B from above the further patterned first material layer (116A or 20A).

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of designing masks for use in semiconductor manufacturing, the method comprising:
    identifying an overall target pattern comprised of at least one hole-type feature;
    decomposing the overall target pattern into at least a first sub-target pattern and a second sub-target pattern, wherein the first sub-target pattern and the second sub-target pattern each comprise at least one common hole-type feature;
    generating a first set of mask data information corresponding to the first sub-target pattern; and
    generating a second set of mask data information corresponding to the second sub-target pattern.

2. The method of claim 1, further comprising providing the first and second sets of the mask data information to a mask manufacturer for purposes of manufacturing a first mask corresponding to the first sub-target pattern and a second mask corresponding to the second sub-target pattern.

3. The method of claim 2, further comprising manufacturing said first and second masks.

4. The method of claim 1, wherein the step of decomposing said overall target pattern comprises decomposing said overall target pattern into an additional third sub-target pattern, wherein said third sub-target pattern comprises said at least one common hole-type feature.

5. The method of claim 1, further comprising performing an optical proximity correction process on said first and second sub-target patterns prior to generating the first and second sets of mask data information.

6. The method of claim 1, wherein said at least one hole-type feature is an opening for a conductive contact, a trench for a metal line, an opening for a conductive via, or a trench formed in a semiconducting substrate.

7. A method of designing masks for use in semiconductor manufacturing, the method comprising:
    identifying an overall target pattern comprised of at least one hole-type feature;
    decomposing the overall target pattern into at least a first sub-target pattern and a second sub-target pattern, wherein the first sub-target pattern and the second sub-target pattern each comprise at least one common hole-type feature;
    performing an optical proximity correction process on said first and second sub-target patterns;
    after performing the optical proximity correction process:
        generating a first set of mask data information corresponding to the first sub-target pattern; and
        generating a second set of mask data information corresponding to the second sub-target pattern; and
        providing the first and second sets of the mask data information to a mask manufacturer for purposes of manufacturing a first mask corresponding to the first sub-target pattern and a second mask corresponding to the second sub-target pattern.

8. The method of claim 7, further comprising manufacturing said first and second masks.

9. The method of claim 7, wherein the step of decomposing said overall target pattern comprises decomposing said overall target pattern into an additional third sub-target pattern, wherein said third sub-target pattern comprises said at least one common hole-type feature.

* * * * *